United States Patent [19]

Nakashima et al.

[11] Patent Number: 5,264,050
[45] Date of Patent: Nov. 23, 1993

[54] FE-NI BASED ALLOY

[75] Inventors: Nobuaki Nakashima; Shinzo Sugai; Eiichi Watanabe, all of Kanagawa, Japan

[73] Assignee: Kabushiki Kaisha Toshiba, Kanagawa, Japan

[21] Appl. No.: 793,368

[22] PCT Filed: Jun. 28, 1991

[86] PCT No.: PCT/JP91/00878
§ 371 Date: Jan. 6, 1992
§ 102(e) Date: Jan. 6, 1992

[87] PCT Pub. No.: WO92/00395
PCT Pub. Date: Jan. 9, 1992

[30] Foreign Application Priority Data

Jun. 29, 1990 [JP] Japan .................. 2-171401

[51] Int. Cl.$^5$ .................. C22C 38/08; C22C 19/03
[52] U.S. Cl. .................. 148/336; 148/328; 148/409; 420/94; 420/459
[58] Field of Search .................. 420/94, 459; 148/336, 148/328, 409

[56] References Cited

U.S. PATENT DOCUMENTS 3,573,897 4/1971 Wache .................. 420/94
5,059,257 10/1991 Wanner et al. .................. 148/328

FOREIGN PATENT DOCUMENTS 60-251251 12/1985 Japan .................. 420/94

Primary Examiner—Deborah Yee
Attorney, Agent, or Firm—Finnegan, Henderson, Farabow, Garrett & Dunner

[57] ABSTRACT

A Fe-Ni based alloy consists essentially of Ni of 25% by weight to 55% by weight, C of 0.001% by weight to 0.1% by weight, at least one element selected from Group IVb elements and Group Vb elements, e.g., Nb, or Ta of 0.01% by weight to 6% weight, and the balance being Fe and unavoidable impurities. The Fe-Ni based alloy contains dispersed particles inclusive of a carbide in the substructure. The carbide is a carbide of the Group IVb element or the Group Vb element. Since the dispersed particle inclusive of the carbide are finely and uniformly present in the substructure, mechanical strength, heat resistance and, a performance of punching work are improved. Additionally, a quantity of gas release in a vacuum can be reduced.

6 Claims, 2 Drawing Sheets

FE-NI BASED ALLOY

TECHNICAL FIELD

The present invention relates to a Fe-Ni based alloy having a small thermal expansion coefficient.

BACKGROUND ART

A Fe-Ni based alloy, e.g., 42 wt % Fe-Ni, 29 wt % Ni, 17 wt % Co-Fe has been hitherto known as an alloy having a low thermal expansion. This kind of Fe-Ni based alloy has been used in industrial application fields where a metallic material having a low thermal expansion coefficient, e.g., a material for a lead frame used for producing an integral circuit package or the like, a material for a part constituting a cathode ray tube for a Braun tube, a material for a part constituting an electron tube, a sealing material are required.

Firstly, description will be provided below as to, e.g., a material for a part constituting a cathode ray tube. A plurality of electrodes for converging or deviating an electron beam emitted from a cathode are arranged in the cathode ray tube. With respect to a material required for constituting the electrodes, it is an essential condition that the material have a small thermal expansion coefficient in order to assure that an electron beam is emitted without any undesirable disturbance due to thermal expansion during the working of the cathode ray tube. For this reason, the foregoing kind of Fe-Ni based alloy is employed. In addition, with respect to a shadow mask to be arranged in the cathode ray tube, the same kind of Fe-Ni based alloy is employed for the same reason as mentioned above.

However, although a conventional Fe-Ni based alloy satisfactorily meets the requirement for a low thermal coefficient, it has the following drawbacks. Accordingly, many strong requests have been raised so as to obviate these drawbacks.

One of the drawbacks inherent to the conventional Fe-Ni based alloy is that a bur having a high height results during a punching operation performed by actuating a press machine. When a material having a bur having a high height formed in a punching region is employed for a part constituting a cathode ray tube, there arises a malfunction and electron beam properties are adversely affected. This problem likewise appears when the foregoing kind of material is employed for a part constituting an electron ray tube. In addition, in the case where this material is employed for forming a lead frame, if a bur has a high height, there appear problems that the number of bending the lead pin is reduced, and moreover, a running life of a press die is shortened. Also with respect to the sealing material, when a bur is located, e.g., in the sealing region, cracks readily extend from the sealing region, whereby properties of the part are affected adversely.

In recent years, as semiconductor elements are integrated at a higher density, it is increasingly required that each lead frame is designed to have a thinner thickness while using a number of pins. In connection with the foregoing current status, a material for forming a lead frame, composed of the conventional Fe-Ni based alloy, has problems that a fine pattern can not be formed with excellent reproductivity, and moreover the material has insufficient mechanical strength and heat resistance. Not only with the material for forming a lead frame but also with a material for forming a part constituting a cathode ray tube, when the material for forming a part constituting a cathode ray tube has insufficient mechanical strength and heat resistance, it is remarkably softened by heat treatment carried out before an assembling operation. This leads to problems that handling capability is degraded and undesirable deformation is liable to occur during the assembling operation.

Generally, the conventional Fe-Ni based alloy has a large quantity of dissolved gas. For this reason, when it is employed as a material for forming a part constituting a cathode ray tube or a material for forming a part constituting an electron tube, there appear problems that a quantity of gas release in a vacuum is increased and a degree of vacuum in the cathode ray tube or the electron ray tube is lowered, resulting in properties of a products being degraded undesirably.

The present invention has been made with the foregoing background in mind.

An object of the present invention is to provide a Fe-Ni based alloy which assures that mechanical strength, heat resistance and other properties are improved.

Other object of the present invention is to provide a Fe-Ni based alloy having excellent working properties such as a performance of punching work.

Another object of the present invention is to provide a Fe-Ni based alloy which assures that a quantity of gas release in a vacuum is kept small.

DISCLOSURE OF THE INVENTION

According to the present invention, there is provided a Fe-Ni based alloy which is characterized in that the Fe-Ni alloy contains Ni of 25% by weight to 55% by weight, C of 0.001% by weight to 0.1% by weight and at least one element of 0.01% by weight to 6% by weight selected from Group IVb elements and Group Vb elements and the balance is substantially composed of Fe and unavoidable impurities. In addition, the Fe-Ni based alloy of the present invention is characterized in that dispersed particles inclusive of carbide are contained in the substructure of the Fe-Ni based alloy.

The reason why a composition of the Fe-Ni based alloy of the present invention has been defined in the above-described manner will be described in the following.

Nickel is an element which serves to reduce a thermal expansion coefficient. The thermal expansion coefficient is increased either when a content of the nickel is less than 25% by weight or when it exceeds 55% by weight, resulting in an effective feature, derived from the alloy having a low thermal expansion coefficient, being lost undesirably. It is preferable that the content of Ni remains within the range of 36% by weight to 50% by weight.

A carbon finely and uniformly disperses in the substructure as a carbide or at least a part of one element selected from the Group IVb elements and the Group Vb elements. As a result, mechanical strength and heat resistance can substantially be improved while an adequate performance of punching work is given to the Fe-Ni based alloy. The carbon functions as a deoxidizer agent when producing an ingot. In other words, a characteristic of the present invention is that the carbon is intentionally added. According to the present invention, a content of the carbon is determined to remain within the range of 0.001% by weight to 0.1% by weight. If the carbon content is less than 0.001% by weight, strength and heat resistance fail to be improved satisfactorily, and sufficient deoxidation can not be achieved when raw materials for the Fe-Ni based alloy are molten. On the contrary, if the carbon content exceeds 0.1% by weight, the property of workability is degraded, and moreover, mechanical strength is excessively increased, resulting in a performance of pressing work for forming various kinds of parts to their predetermined contour being degraded remarkably. It is more preferable that the carbon content is determined to remain with in the range of 0.01% by weight to 0.05% by weight.

At least one element selected from the Group IVb elements and the Group Vb elements is precipitated or crystallized in the form of a single element, a compound such as a carbide, nitride or an intermetallic compound of Fe, and it is present in the form of dispersed particles in the substructure. Thus, mechanical strength and heat resistance can be improved while an adequate performance of punching work is obtained. In addition, the foregoing element serves to fixate a dissolved gas component as a carbide or nitride so as to reduce a quantity of gas release in a vacuum. Especially, the Group IVb elements and the Group Vb elements are an element which is liable to be precipitated as a carbide or nitride. Since the aforementioned effect can remarkably be obtained when one element selected especially from Nb and Ta is used as the foregoing element, it is desirable that the foregoing element is used.

A content of at least one element selected from the Group IVb elements and the Group Vb elements is determined to remain within the range of 0.001% by weight to 6% by weight. If the content of the foregoing element is less than 0.01% by weight, the added element is solid-dissolved in a matrix, resulting in a quantity of dispersed particles composed of carbide becoming short. Thus, mechanical strength and heat resistance can not be improved sufficiently. Additionally, a quantity of gas release is undesirably increased. On the contrary, if the content of the foregoing element exceeds 6% by weight, a property of workability is degraded, and moreover, mechanical strength is excessively increased, resulting in a property of press-working for forming various kinds of parts to their predetermined contour being degraded remarkably. It is more preferable that a content of at least one kind of element selected from the Group IVb elements and the Group Vb elements is determined to remain within the range of 0.1% by weight to 3% by weight. With respect to the Group IVb elements and the Group Vb elements, a plurality of elements may be used. Alternatively, a single element may be used. In the case where a plurality of elements are used, the total content of these elements should be determined to remain within the aforementioned range.

In addition, in the Fe-Ni based alloy of the present invention, it is preferable that a content of S as an impurity is less than 0.05% by weight. This is because if the content of sulfur exceeds 0.05% by weight, a quantity of gas release in a vacuum is increased. Advantageous effects derived from the present invention are not adversely affected even when Mn, added as a deoxidizing agent is contained by a quantity of not more than 2% by weight, and moreover, impurities such as P, Si are contained by a quantity of not more than about 0.1% by weight.

As described above, in the Fe-Ni based alloy of the present invention, dispersed particles inclusive of a carbide of the Group IVb elements and the Group Vb elements are present in the substructure. Since the carbide is finely and uniformly dispersed in the substructure, mechanical strength, heat resistance, a performance of punching work and other properties of the Fe-Ni based alloy are improved effectively. In other words, an effect derived from dispersion can be improved further, and moreover, mechanical strength can be improved by uniformly dispersing the fine particles of a carbide in the substructure. In addition, since dislocation at high temperatures is suppressed, heat resistance such as softening can be improved. Additionally, since a performance of punching work is improved by the fine crystalline structure due to the dispersed particles, the height of a bur can be reduced.

It is preferable that a size of the dispersed particle is not more than 20 $\mu$m, and moreover, it is preferable that the dispersed particles having the foregoing size are present within the range of 1000 particles/cm$^2$ to 100000 particles/cm$^2$. It is more preferable that the number of dispersed particles remains within the range of 5000 particles/cm$^2$ to 100000 particles/cm$^2$. If a size of the dispersed particle exceeds 20 $\mu$m, mechanical strength and heat resistance fail to be sufficiently improved and a performance of punching work is degraded. As a result, there is a tendency that the height of a bur appearing around a punched hole (hereinafter referred to as a hole bur) is increased. It should be noted that a size of the dispersed particle which has been referred to herein designates a diameter of a smallest circle in which the dispersed particle is included. When the number of dispersed particles is smaller than 1000 particles/cm$^2$, mechanical strength and heat resistance fail to be sufficiently improved. In addition, there is a tendency that a performance of punching work is degraded, the height of the hole bur is increased and a breakage angle becomes small. On the contrary, if the number of dispersed particles exceeds 100000 particles/cm$^2$, a performance of rolling work or the like is degraded.

The Fe-Ni based alloy of the present invention is produced, e.g., by way of the following steps.

First, alloy components satisfying the requirement for the aforementioned alloy composition are molten and cast within the temperature range of 1400° C. to 1600° C. to produce an ingot. Subsequently, the ingot is subjected to hot forging and/or hot rolling within the temperature range of about 1000° C. to 1200° C. Thereafter, the resultant plate is repeatedly subjected to cold working at a working rate of 30 to 80% as well as annealing for a period of time of five minutes to one hour at a temperature of about 800° C. to 1100° C. As a result, a required Fe-Ni based alloy is obtained.

For example, in the case where the Fe-Ni based alloy is employed for forming a lead frame, the hot working and cold working are employed to produce a sheet material having a predetermined thickness. Subsequently, the sheet is subjected to punching to form a lead frame having a predetermined contour. In the case where the Fe-Ni based alloy is employed as a material for forming a part constituting a cathode ray tube, the aforementioned operations are conducted.

BEST MODE FOR CARRYING OUT THE INVENTION

Figure 1:
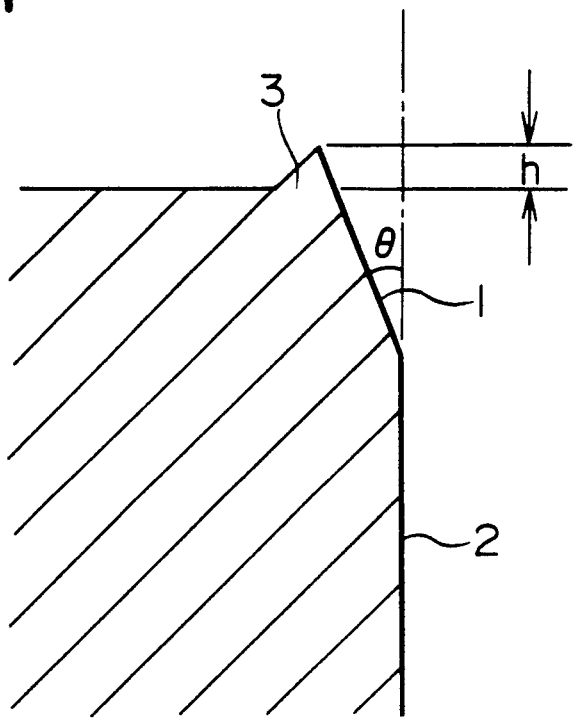
FIG. 1 is a view for explaining an evaluation method of a performance of punching work.

Now, the present invention will be described in detail which illustrate preferred embodiments of the present invention.

First, description will be made below with respect to examples of a Fe-Ni based alloy of the present invention and results derived from evaluation on these examples.

EXAMPLE 1 to 23

Alloy components each of which composition is shown in Table 1 were molten at a temperature of about 1500° C. and each molten alloy was cast to form ingots. Thereafter, each ingot was forged at a temperature of 1000° C. to 1200° C. to produce a billet having dimensions of 150 mm×600 mm×L.

Thereafter, each billet was subjected to hot rolling at a temperature of 1000° C. to 1200° C. until its thickness was reduced to 3.5 mm. Subsequently, the plate was repeatedly subjected to cold rolling and annealing under conditions of about 950° C.×about 30 minutes until its thickness was reduced to 0.3 mm. After the cold rolled sheet was additionally subjected to cold rolling to reduce its thickness to 0.15 mm, it was annealed at a temperature of about 950° C. for about 30 minutes, whereby a plate-shaped alloy sample was obtained.

A size and the number of particles dispersed within several visual fields in each plate-shaped alloy sample obtained in the above-described manner were measured based on structure photographs by a metallurgical microscope having a magnification of 400. Results derived from the measurement are shown in Table 2. It should be noted that the size of particles dispersed shown in the table is represented by an average value. In addition, with respect to the respective plate-shaped alloy samples, the following properties were evaluated. These results are shown also in Table 2.

(1) Thermal expansion coefficient

Numerals in a column of thermal expansion coefficient show a thermal expansion coefficient measured within the temperature range of 30° C. to 300° C.

(2) Variation of hardness for heat treatment

Each plate-shaped sample was subjected to heat treatment at a temperature of 1050° C. for 10 minutes, and hardness before and after the heat treatment were measured.

(3) Performance of punching work

A punching operation was performed for each plate-shaped sample with the aid of a press machine so as to form a hole, and a height of a bur appearing around the punched hole and a breakage angle were measured based on the sectional form.

(4) Property of gas release

A quantity of gas release in a vacuum of $10^{-7}$ Torr was measured with respect to each plate-shaped sample.

(5) Speed of gas release

A speed of gas release in the vacuum of $10^{-7}$ Torr was measured with respect to each plate-shaped sample.

Evaluation on the performance of punching work as mentioned in the (3) was carried out such that a height h of the bur 3 appearing around the end of a broken surface 1 was measured as a bur height and that an angle $\theta$ defined by the broken surface 1 of the punched part and a punched surface 2 of the same was measured as a breakage angle. The smaller the breakage angle $\theta$, the larger the height h of the bur 3. In addition, the bur 3 was liable to tilt toward the punched hole side, causing various problems.

Additionally, for the purpose of comparison with the present invention, plate-shaped samples were similarly produced, using a Fe-Ni based alloy departing from the scope of the present invention (Comparative Examples 1 to 6). The compositions of the samples are shown in Table 1. Evaluation was carried out on the respective plate-shaped samples in the same manner as the aforementioned examples. The results are additionally shown in Table 2.

As is apparent from the results shown in Table 2, the Fe-Ni based alloy in the examples have a low thermal coefficient but exhibit a high hardness. In addition, the hardness of each plate-shaped sample was few reduced after completion of a heat treatment at a temperature of 1050° C., Additionally, the breakage angle recognized after completion of a punching operation was large, and moreover, the height h of the bur is low. In other words, the Fe-Ni based alloy of the present invention is superior in a performance of punching work. A quantity of gas release in a vacuum is small.

As is apparent from the above description, in the case where the Fe-Ni based alloy of the present invention is employed for a material requiring a low thermal expansion coefficient such as a material for forming a lead frame, a material for forming a part constituting a cathode ray tube, a material for forming a part constituting an electron tube, a sealing material, even if it is a thin plate, the requirements for mechanical strength, heat resistance and other properties can be satisfied and reproductivity of a shape can be improved. For example, when it is employed as a material for forming a lead frame, the above-mentioned advantages are obtained and, moreover, the number of bending a lead can be improved. When it is employed as a material for forming a part constituting a cathode ray tube, it becomes possible to prevent its electron beam properties from being adversely affected, whereby a performance of assembling operation can be improved. Additionally, since a quantity of gas release is reduced substantially, properties of each product can be improved.

Next, the present invention will be described below with respect to an embodiment wherein the Fe-Ni based alloy of the present invention is employed for forming a lead frame.

Figure 2:
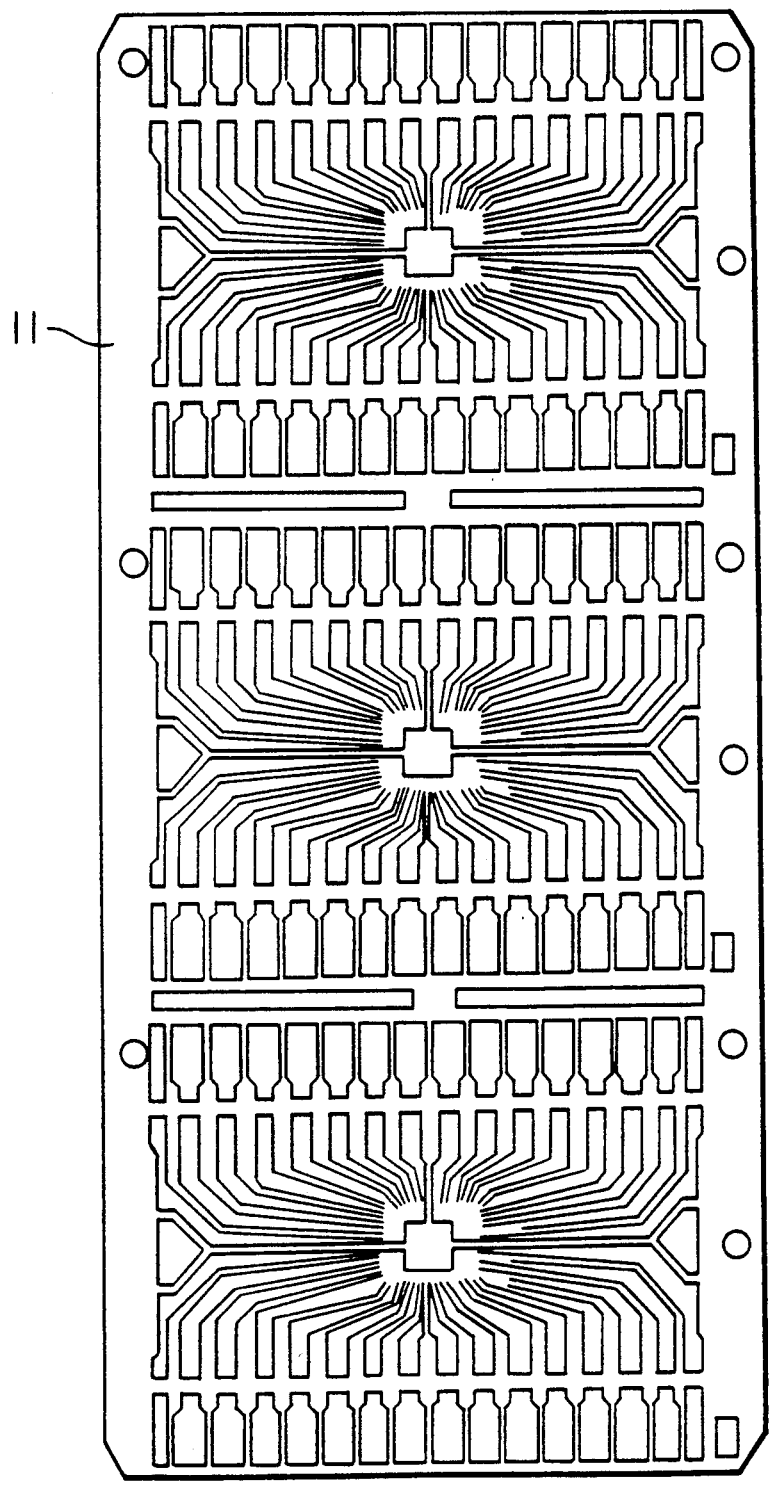
FIG. 2 is a plan view of a lead frame of one embodiment where the Fe-Ni based alloy of the present invention is used.

First, the Fe-Ni based alloy in Example 2 was repeatedly subjected to cold rolling and annealing under conditions of 950° C.×about 30 minutes so as to produce a sheet having a thickness of 0.25 mm. Subsequently, the sheet of the Fe-Ni based alloy was subjected to punching to exhibit a contour of the lead frame as shown in FIG. 2, whereby a required lead frame 11 was obtained.

For the purpose of comparison with the present invention, a lead frame was produced in the same manner as mentioned above using the Fe-Ni based alloy in Comparative Example 1.

Then, a hardness of each lead frame produced in the above-described manner as well as a running life of a punching die (represented by the total number of punching operations practically performed) were measured. Hardness (Hv) was 203 and the total number of punching operations was $850 \times 10^3$ with respect to the lead frame in Comparative Example 1, while hardness (Hv) was 240 and the total number of punching operations $1300 \times 10^3$ with respect to the lead frame in Example 2. This means that mechanical strength and a performance of punching work were improved with respect to the lead frame in Example 2 compared with those of the lead frame in Comparative Example 1.

Next, the present invention will be described below with respect to an embodiment wherein the Fe-Ni based alloy of the present invention was employed as a material for forming a part constituting a cathode ray tube.

Figure 3:
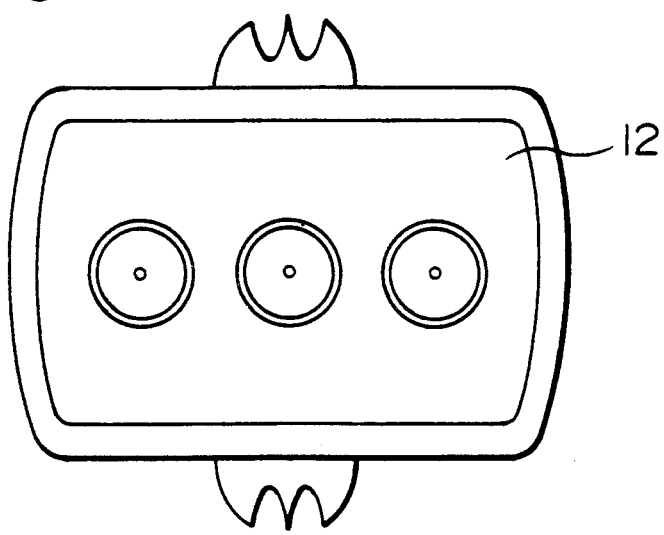
FIG. 3 is a plan view of a part constituting a cathode ray tube of another embodiment where the Fe-Ni based alloy of the present invention is used.

First, the Fe-Ni based alloy in Example 1 was repeatedly subjected to cold rolling and annealing under conditions of about 950° C. × about 30 minutes so as to produce a sheet having a thickness of 0.175 mm. Subsequently, the sheet of Fe-Ni based alloy was subjected to punching to exhibit a contour of the part constituting a cathode ray tube as shown in FIG. 3, whereby a required part 12 for a cathode ray tube was obtained.

For the purpose of comparison with the present invention, a part constituting a cathode ray tube was produced using the Fe-Ni based alloy in Comparative Example 2.

A cathode ray tube was assembled using the part produced in the above-described manner and a rate of rejection due to deformation of the part was then measured. The rate of rejection was 0.6% with respect to the part constituting a cathode ray tube in Comparative Example 2, while the rate of rejection was 0.04% with respect to the part constituting a cathode ray tube in Example 1. This means that the rate of rejection due to deformation of the part Example 1 was remarkably improved compared with the part constituting a cathode ray tube in Comparative Example 2.

INDUSTRIAL APPLICABILITY

As described above, the Fe-Ni based alloy of the present invention assures that the requirement for a low thermal expansion coefficient is satisfied, it has a high hardness and excellent heat resistance, it is superior in performance of punching work, and moreover, a quantity of gas release in the vacuum is small. Owing to these advantages, the present invention can provide an alloy material preferably employable for, e.g., a material for forming a lead frame and a material for forming a part constituting a cathode ray tube.

TABLE 1

| | ALLOY COMPOSITION | | | | | | | | | |
|---|---|---|---|---|---|---|---|---|---|---|
| | Ni | Nb | Ta | Zr | Ti | V | Hf | C | S | Fe |
| EXAMPLES | | | | | | | | | | |
| 1 | 36.3 | 4.23 | — | — | — | — | — | 0.007 | 0.001 | BALANCE |
| 2 | 41.7 | 2.03 | — | — | — | — | — | 0.021 | 0.002 | " |
| 3 | 42.0 | 1.47 | — | — | — | — | — | 0.018 | 0.001 | " |
| 4 | 41.1 | 0.47 | — | — | — | — | — | 0.042 | 0.002 | " |
| 5 | 49.7 | 0.04 | — | — | — | — | — | 0.092 | 0.002 | " |
| 6 | 36.4 | — | 5.21 | — | — | — | — | 0.031 | 0.001 | " |
| 7 | 41.3 | — | 1.68 | — | — | — | — | 0.030 | 0.001 | " |
| 8 | 50.1 | — | 0.63 | — | — | — | — | 0.074 | 0.004 | " |
| 9 | 35.8 | — | — | 1.25 | — | — | — | 0.024 | 0.002 | " |
| 10 | 42.4 | — | — | 0.51 | — | — | — | 0.055 | 0.004 | " |
| 11 | 49.6 | — | — | 0.14 | — | — | — | 0.012 | 0.002 | " |
| 12 | 41.5 | — | — | — | 3.05 | — | — | 0.014 | 0.002 | " |
| 13 | 42.0 | — | — | — | 1.83 | — | — | 0.018 | 0.001 | " |
| 14 | 35.7 | — | — | — | 0.64 | — | — | 0.062 | 0.003 | " |
| 15 | 36.3 | — | — | — | — | 4.01 | — | 0.012 | 0.002 | " |
| 16 | 42.0 | — | — | — | — | 1.85 | — | 0.006 | 0.002 | " |
| 17 | 50.0 | — | — | — | — | 0.42 | — | 0.071 | 0.002 | " |
| 18 | 36.6 | — | — | — | — | — | 4.11 | 0.013 | 0.002 | " |
| 19 | 40.9 | — | — | — | — | — | 2.12 | 0.014 | 0.001 | " |
| 20 | 49.3 | — | — | — | — | — | 0.73 | 0.087 | 0.002 | " |
| 21 | 41.5 | 0.57 | 0.43 | — | — | — | — | 0.011 | 0.001 | " |
| 22 | 36.4 | 1.15 | — | — | 0.44 | — | — | 0.023 | 0.002 | " |
| 23 | 50.5 | — | — | 0.11 | — | 1.35 | — | 0.041 | 0.001 | " |
| COMPARATIVE EXAMPLES | | | | | | | | | | |
| 1 | 42.1 | — | — | — | — | — | — | 0.027 | 0.006 | " |
| 2 | 41.8 | — | — | — | — | — | — | 0.18 | 0.005 | " |
| 3 | 36.3 | — | — | — | — | — | — | 0.062 | 0.004 | " |
| 4 | 51.2 | — | — | — | — | — | — | 0.041 | 0.007 | " |
| 5 | 41.8 | 7.43 | — | — | — | — | — | 0.091 | 0.001 | " |
| 6 | 36.0 | — | 4.32 | 3.40 | — | — | — | 0.033 | 0.002 | " |

TABLE 2

| | SIZE OF DISPERSED PARTICLES (m) | NUMBER OF DISPERSED PARTICLES | THERMAL EXPANSION COEFFICIENT ($\times 10^{-7}$/°C.) | HARDNESS (Hv) | | HEIGHT OF HOLE BUR |
|---|---|---|---|---|---|---|
| | | | | BEFORE HEAT TREATMENT | AFTER HEAT TREATMENT | |
| EXAMPLES | | | | | | |
| 1 | 7.3 | 23050 | 88.1 | 181 | 160 | 0~1 |
| 2 | 7.4 | 8150 | 51.1 | 167 | 147 | 0~1 |
| 3 | 6.8 | 6740 | 52.7 | 157 | 141 | 0~2 |
| 4 | 6.4 | 5300 | 50.6 | 155 | 142 | 0~1 |
| 5 | 5.3 | 3700 | 94.5 | 146 | 137 | 0~3 |
| 6 | 10.4 | 21070 | 89.2 | 173 | 156 | 0~1 |
| 7 | 8.3 | 4850 | 50.3 | 162 | 145 | 0~1 |
| 8 | 8.2 | 3960 | 95.7 | 148 | 139 | 0~3 |
| 9 | 9.0 | 13200 | 87.9 | 174 | 152 | 0~1 |
| 10 | 8.5 | 3680 | 50.9 | 147 | 141 | 0~1 |

TABLE 2-continued

| | | | | | | |
|---|---|---|---|---|---|---|
| 11 | 7.4 | 2040 | 96.1 | 146 | 136 | 0~3 |
| 12 | 9.7 | 11400 | 50.1 | 164 | 148 | 0~1 |
| 13 | 8.6 | 7400 | 51.6 | 157 | 145 | 0~2 |
| 14 | 7.2 | 4300 | 87.5 | 151 | 142 | 0~2 |
| 15 | 10.7 | 23400 | 88.3 | 176 | 155 | 0~1 |
| 16 | 8.4 | 5300 | 49.9 | 146 | 132 | 0~2 |
| 17 | 8.2 | 3200 | 96.2 | 151 | 144 | 0~1 |
| 18 | 7.8 | 9460 | 87.7 | 147 | 140 | 0~3 |
| 19 | 7.9 | 6070 | 48.3 | 165 | 143 | 0~3 |
| 20 | 6.7 | 2860 | 95.9 | 143 | 138 | 0~2 |
| 21 | 9.2 | 7100 | 51.3 | 158 | 142 | 0~2 |
| 22 | 8.3 | 6700 | 89.0 | 162 | 147 | 0~2 |
| 23 | 10.2 | 5800 | 96.2 | 154 | 141 | 0~3 |
| COMPARATIVE EXAMPLES | | | | | | |
| 1 | 31 | 970 | 45.7 | 140 | 112 | 3~5 |
| 2 | 33 | 840 | 46.2 | 144 | 110 | 3~5 |
| 3 | 29 | 910 | 84.3 | 142 | 114 | 3~5 |
| 4 | 27 | 930 | 94.2 | 145 | 110 | 3~5 |
| 5 | | | (NO WORKING CONDUCTED) | | | |
| 6 | | | (NO WORKING CONDUCTED) | | | |

| | BREAKAGE ANGLE | QUANTITY OF GAS RELEASE (Torr · cc) | SPEED OF GAS RELEASE ($\times 10^{-3}$ Torr · cc/sec · g) |
|---|---|---|---|
| EXAMPLES | | | |
| 1 | 15~20 | 6.8 | 0.71 |
| 2 | 13~20 | 8.7 | 0.68 |
| 3 | 12~18 | 9.4 | 0.97 |
| 4 | 12~20 | 11.3 | 1.04 |
| 5 | 11~16 | 12.4 | 1.12 |
| 6 | 12~20 | 9.7 | 0.69 |
| 7 | 11~23 | 9.6 | 0.83 |
| 8 | 12~17 | 10.7 | 1.02 |
| 9 | 14~20 | 10.1 | 0.92 |
| 10 | 16~19 | 11.2 | 1.11 |
| 11 | 12~17 | 10.3 | 0.95 |
| 12 | 13~21 | 9.8 | 0.91 |
| 13 | 12~19 | 8.7 | 0.89 |
| 14 | 11~17 | 10.0 | 1.03 |
| 15 | 12~19 | 7.4 | 0.88 |
| 16 | 11~15 | 8.5 | 0.98 |
| 17 | 12~18 | 9.3 | 0.96 |
| 18 | 11~18 | 9.3 | 0.83 |
| 19 | 13~22 | 9.4 | 0.91 |
| 20 | 12~16 | 10.5 | 0.97 |
| 21 | 12~20 | 8.9 | 0.74 |
| 22 | 12~19 | 8.5 | 0.82 |
| 23 | 11~17 | 9.2 | 0.98 |
| COMPARATIVE EXAMPLES | | | |
| 1 | 10~11 | 17.1 | 1.90 |
| 2 | 10~12 | 19.1 | 1.95 |
| 3 | 10~11 | 18.3 | 1.86 |
| 4 | 10~11 | 19.7 | 1.94 |
| 5 | | (NO WORKING CONDUCTED) | |
| 6 | | (NO WORKING CONDUCTED) | |

What is claimed is:

1. A Fe-Ni based alloy for use in a cathode ray tube consisting essentially of:
   25 to 55% by weight of Ni, 0.001 to 0.1% by weight of C and 0.1 to 6% by weight of at least one element selected from the group consisting of Group IVb elements and Group Vb elements; and
   the balance being Fe and unavoidable impurities,
   wherein said alloy has dispersed carbide particles in a substructure thereof within the range of 1000 to 100,000 particles/cm$^2$, with each of said dispersed carbide particles having a size of not more than 20 μm.

2. A Fe-Ni based alloy as claimed in claim 1, wherein a carbide of said dispersed carbide particles is at least one carbide selected from the group consisting of carbides of Group IVb elements and Group Vb elements.

3. A Fe-Ni based alloy as claimed in claim 1, wherein said at least one element selected from the group consisting of Group IVb elements and Group Vb elements is at least one element selected from Nb and Ta.

4. A part for a cathode ray tube comprising a Fe-Ni based alloy consisting essentially of Ni 25 to 55% by weight, C 0.001 to 0.1% by weight, 0.1 to 6% by weight of at least one element selected from the group consisting of Group IVb elements and Group Vb elements, and the balance being Fe and unavoidable impurities;
   wherein said alloy has dispersed carbide particles in a substructure thereof within the range of 1000 to 100,000 particles/cm$^2$, with each of said dispersed carbide particles having a size of not more than 20 μm.

5. A Fe-Ni based alloy, for use in a cathode ray tube, consisting essentially of:
   20 to 55% by weight of Ni,
   0.001 to 0.1% by weight of C, 0.1 to 6% by weight of at least one element selected from the group consisting of Group IVb elements and Group Vb elements, and the balance of Fe and unavoidable impurities, wherein said Fe-Ni alloy has dispersed carbide particles in a substructure thereof within the range of 1000 to 100,000 particles/cm$^2$, with each of said dispersed carbide particles having a size of not more than 20 μm, a quantity of gas release in a vacuum of $10^{-7}$ Torr of said Fe-Ni alloy is less than 13×Torr cc and a speed of gas release in a vacuum of $10^{-7}$ Torr of said Fe-Ni alloy is less than $1.2 \times 10^{-3}$ Torr.cc/sec.g.

6. A part of a cathode ray tube, comprising a Fe-Ni based alloy consisting essentially of Ni 25 to 55% by weight, C 0.001 to 0.1% by weight, 0.1 to 6% by weight of at least one element selected from the group consisting of Group IVb elements and Group Vb elements, and the balance of Fe and unavoidable impurities;

wherein said alloy has dispersed carbide particles in the substructure thereof within the range of 1000 to 100,000 particles/cm$^2$, with each of said dispersed carbide particles having a size of not more than 20 μm, a quantity of gas released in a vacuum of $10^{-7}$ Torr of said Fe-Ni alloy is less than 13×Torr cc and a speed of gas release in a vacuum of $10^{-7}$ Torr of said Fe-Ni alloy is less than $1.2 \times 10^{-3}$ Torr.cc/sec.g.

* * * * *